(12) United States Patent
Itoh et al.

(10) Patent No.: US 6,707,648 B2
(45) Date of Patent: Mar. 16, 2004

(54) MAGNETIC DEVICE, MAGNETIC HEAD AND MAGNETIC ADJUSTMENT METHOD

(75) Inventors: Akiyoshi Itoh, Chiba (JP); Katsuji Nakagawa, Tokyo (JP)

(73) Assignee: Nih n University (JP)

( * ) Notice: Subject to any disclaimer, the term of this patent is extended or adjusted under 35 U.S.C. 154(b) by 224 days.

(21) Appl. No.: 09/859,642

(22) Filed: May 18, 2001

(65) Prior Publication Data

US 2002/0030949 A1 Mar. 14, 2002

(30) Foreign Application Priority Data

May 19, 2000 (JP) ........................................ 2000-149090

(51) Int. Cl.[7] ................................................ G11B 5/39
(52) U.S. Cl. ........................................ 360/322; 360/324
(58) Field of Search ................................ 360/313, 314, 360/322, 324

(56) References Cited

U.S. PATENT DOCUMENTS

| | | | | |
|---|---|---|---|---|
| 5,474,833 A | * | 12/1995 | Etienne et al. | 428/209 |
| 5,527,626 A | * | 6/1996 | Gijs et al. | 428/611 |
| 5,589,278 A | * | 12/1996 | Kamijo | 428/611 |
| 5,680,091 A | * | 10/1997 | Maeda et al. | 338/32 R |
| 5,695,858 A | * | 12/1997 | Maeda et al. | 428/209 |
| 5,783,284 A | * | 7/1998 | Shinjo et al. | 428/161 |
| 6,075,360 A | * | 6/2000 | Mouchot et al. | 324/251 |
| 6,118,623 A | * | 9/2000 | Fatula et al. | 360/320 |

FOREIGN PATENT DOCUMENTS

| | | | |
|---|---|---|---|
| JP | 4-123306 | * | 4/1992 |
| JP | 7-221364 | * | 8/1995 |

OTHER PUBLICATIONS

"GMR of Co/Cu multilayer fabrication by FIB", Hachiya et al.

* cited by examiner

*Primary Examiner*—David L. Ometz
(74) *Attorney, Agent, or Firm*—Rader, Fishman & Grauer PLLC

(57) ABSTRACT

A magnetic element having an improved MR rate. The magnetic element 1 is made up of plural layered films of different compositions and exhibits a magneto-resistance effect that the magneto-resistance value is changed on application of a magnetic field. The magnetic element 1 includes a recess 11 for transmitting the current along the layering direction of the layered films. The current flows through the portion of the magnetic element 1 not having the recess 11 so as to have a component along the film layering direction A, with the result that electrons taking part in current conduction may be propagated as the electrons traverse the boundary surfaces of the plural layered films.

7 Claims, 8 Drawing Sheets

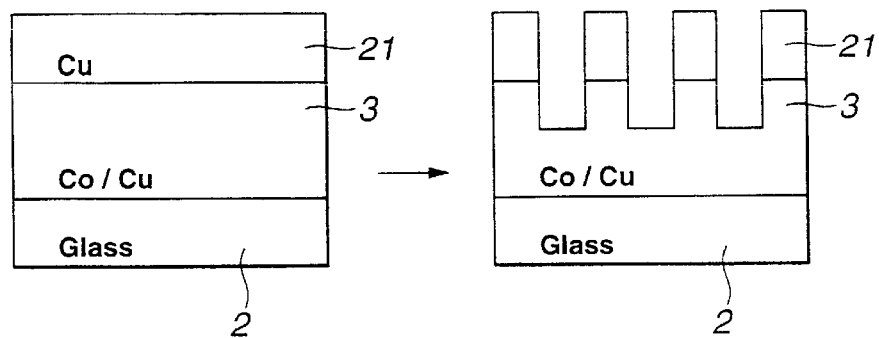
FIG.7A  FIG.7B
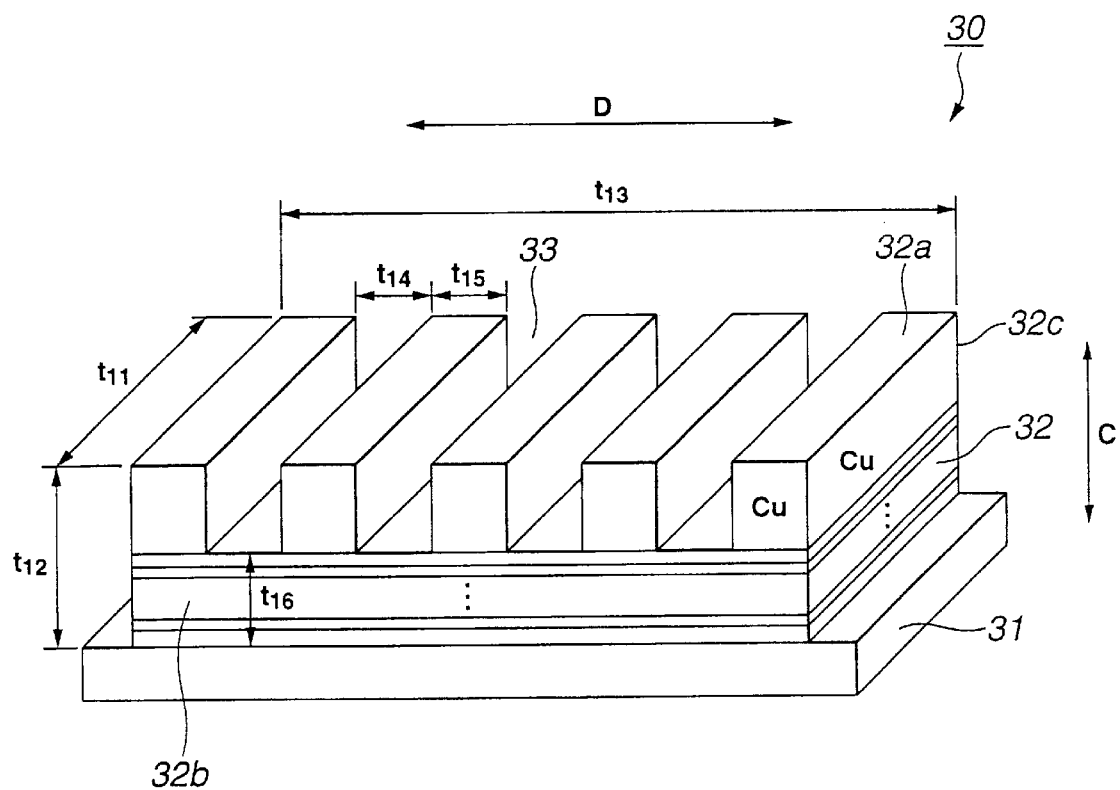
FIG.8

UPPER AREA

LOWER AREA

MAGNETIC DEVICE, MAGNETIC HEAD AND MAGNETIC ADJUSTMENT METHOD

BACKGROUND OF THE INVENTION

1. Field of the Invention

This invention relates to a magnetic element and a magnetic head exploiting the magneto-resistance effect, and a magnetic adjustment method for adjusting magneto-resistance characteristics of the magnetic element.

2. Description of Related Art

The giant magneto-resistance effect (GMR) is expected to be applied to a magneto-resistance effect type magnetic head, referred to below as an MR head, of a high sensitivity. On the other hand, the MR head exploiting the GMR is desirably of a small size in keeping with improvement in the recording density of the recording medium. That is, the MR head for a high density recording medium is desirably an MR device having a small sample size and exhibiting a large MR rate.

So, a layered magnetic element exhibiting a large rate of change of magneto-resistance, referred to below as the MR rate, for a small sample size not larger than one submicron, has been proposed. This sort of the magnetic element is exemplified by an MR head of an artificial lattice structure comprised of plural different sorts of materials layered together.

The MR head of the artificial lattice structure detects signals recorded on a magnetic recording medium by exploiting changes in the electrical resistance value depending on the direction of magnetization when the current is supplied in the in-plane-direction of the layered films.

In this MR head, in detecting signals of a recording medium, the current is supplied to the MR device and changes in the electrical resistance value as a result of application of a stray magnetic field are detected. As a technique of supplying the current to the MR device, it is known that the magneto-resistance effect when the current is supplied in a direction perpendicular to the film surface CPP (current perpendicular to the plane), that is CPP-GMR, is of a larger MR rate than the magneto-resistance effect when the current is supplied in a direction parallel to the film surface CIP (current in plane)-GMR, that is CIP-GMR.

However, the MR element of the artificial lattice structure suffers a problem that the electrical resistance in the direction perpendicular to the plane is on the order of $10^{-15}$ Ω such that changes in the electrical resistance value as a result of application of the magnetic field are so small as to render the measurement difficult.

On the other hand, the magnetic head exploiting the MR element or the MRAM (magnetic random access memory) exploiting the MR element suffers from the problem that, while characteristics of the respective MR elements are desirably in a pre-set range, the production yield is lowered if the MR element lying outside the pre-set range is used.

SUMMARY OF THE INVENTION

It is therefore an object of the present invention to provide a magnetic element having an improved MR rate, a magnetic head having this MR element, and a magnetic adjustment method for improving the production yield of the magnetic head or the MRAM having an MR element.

In one aspect, the present invention provides a magnetic element which is made up of a plurality of films of different compositions, layered together, and which exhibits a magneto-resistance effect of the electrical resistance value being changed on application of a magnetic field thereto, wherein the magnetic element includes a recess for conducting the current along a layering direction of the layered films.

In this magnetic element, in which the current flows through the portion of the magnetic element not having the recess so as to have a component along the film layering direction, with the result that electrons taking part in current conduction may be propagated as the electrons traverse the boundary surfaces of the plural layered films.

In another aspect, the present invention provides a magnetic element which is made up of a plurality of films of different compositions layered together, and which exhibits a magneto-resistance effect of the electrical resistance value being changed on application of a magnetic field thereto, wherein the magnetic element includes a recess for conducting the current along a layering direction of said layered films, and wherein a projection neighboring to said recess is made up of a plurality of layered films of different compositions.

In this magnetic element, in which the current flows through the portion of the magnetic element not having the recess so as to have a component along the film layering direction, with the result that electrons taking part in current conduction may be propagated as the electrons traverse the boundary surfaces of the plural layered films.

In yet another aspect, the present invention provides a magnetic element which is made up of a plurality of films of different compositions layered together, and which exhibits a magneto-resistance effect of the electrical resistance value being changed on application of a magnetic field thereto, wherein the magnetic element includes a recess for conducting the current along a layering direction of said layered films, and wherein a projection neighboring to said recess is made up of a plurality of layered films of a unitary composition.

In this magnetic element, in which the current flows through the portion of the magnetic element not having the recess so as to have a component along the film layering direction, with the result that electrons taking part in current conduction may be propagated as the electrons traverse the boundary surfaces of the plural layered films.

In yet another aspect, the present invention provides a magnetic head including a magneto-resistance element having a magneto-resistance effect of the electrical resistance value being changed as a result of application of a stray magnetic field from a magnetic recording medium, the magneto-resistance element being made up of a plurality of layered films of different compositions and having a recess for transmitting the current along the layering direction of the layered films, and paired electrodes formed at both end faces of the magneto-resistance element perpendicular to the layering direction.

In this magnetic head, in which the current flows through the portion of the magnetic element not having the recess so as to have a component along the film layering direction, with the result that electrons taking part in current conduction may be propagated as the electrons traverse the boundary surfaces of the plural layered films.

In yet another aspect, the present invention provides a magnetic head comprising a magneto-resistance element having a magneto-resistance effect of the electrical resistance value being changed as a result of application of a stray magnetic field from a magnetic recording medium, said magneto-resistance element being made up of a plurality of layered films of different compositions and having a recess for transmitting the current along the layering direction of said layered films, and paired electrodes formed at both end faces of the magneto-resistance element perpendicular to said layering direction, wherein a projection neighboring to said recess is made up of a plurality of layered films of different compositions.

In this magnetic head, in which the current flows through the portion of the magnetic element not having the recess so as to have a component along the film layering direction, with the result that electrons taking part in current conduction may be propagated as the electrons traverse the boundary surfaces of the plural layered films.

In yet another aspect, the present invention provides a magnetic head comprising a magneto-resistance element having a magneto-resistance effect of the electrical resistance value being changed as a result of application of a stray magnetic field from a magnetic recording medium, said magneto-resistance element being made up of a plurality of layered films of different compositions and having a recess for transmitting the current along the layering direction of said layered films, and paired electrodes formed at both end faces of the magneto-resistance element perpendicular to said layering direction, wherein a projection neighboring to said recess is made up of a plurality of layered films of a unitary composition.

In yet another aspect, the present invention provides a magnetic adjustment method including preparing an electronic device including a magnetic element which is made up of a plurality of films of different compositions, layered together, and which exhibits a magneto-resistance effect of the electrical resistance value being changed on application of a magnetic field thereto, and forming a recess for conducting the current along the layering direction of the layered films to provide for a desired degree of the magneto-resistance value.

In this magnetic adjustment method, in which the current flows through the portion of the magnetic element not having the recess, to adjust the magnitude of the component perpendicular to the layering direction to adjust the degree of the magneto-resistance effect of the magnetic element.

In yet another aspect, the present invention provides a magnetic adjustment method comprising preparing an electronic device including a magnetic element which is made up of a plurality of films of different compositions, layered together, and which exhibits a magneto-resistance effect of the electrical resistance value being changed on application of a magnetic field thereto, and forming a recess for conducting the current along the layering direction of said layered films to provide for a desired degree of the magneto-resistance value, a projection neighboring to said recess being formed by a plurality of layered films of different compositions.

In this magnetic adjustment method, in which the current flows through the portion of the magnetic element not having the recess, to adjust the magnitude of the component perpendicular to the layering direction to adjust the degree of the magneto-resistance effect of the magnetic element.

In yet another aspect, the present invention provides a magnetic adjustment method comprising preparing an electronic device including a magnetic element which is made up of a plurality of films of different compositions, layered together, and which exhibits a magneto-resistance effect of the electrical resistance value being changed on application of a magnetic field thereto, and forming a recess for conducting the current along the layering direction of said layered films to provide for a desired degree of the magneto-resistance value, a projection neighboring to said recess being formed by a plurality of layered films of a unitary composition.

In this magnetic adjustment method, in which the current flows through the portion of the magnetic element not having the recess, to adjust the magnitude of the component perpendicular to the layering direction to adjust the degree of the magneto-resistance effect of the magnetic element.

In the magnetic element according to the present invention, in which there is formed a recess for conducting the current in the layering direction of the layered films, it is possible to transmit conduction electrons having a component perpendicular to the film layering direction to increase the magneto-resistance effect.

In the magnetic head according to the present invention, in which there is formed a recess for conducting the current in the layering direction of the layered films, it is possible to transmit conduction electrons having a component perpendicular to the film layering direction to increase the magneto-resistance effect to improve the S/N ratio of detected signals.

In the magnetic adjustment method according to the present invention, in which the degree of the magneto-resistance effect may be adjusted by the recess formed in the magnetic element, it is possible to improve the production yield of the magnetic head or the MRAM having the magnetic element.

BRIEF DESCRIPTION OF THE DRAWINGS

FIG. 7, consisting of FIGS. 7A and 7B, illustrates a method for the preparation of the magnetic element carrying the protective film.

FIG. 8 is a perspective view showing a magnetic element according to the present invention.

DESCRIPTION OF THE PREFERRED EMBODIMENTS

Figure 1:
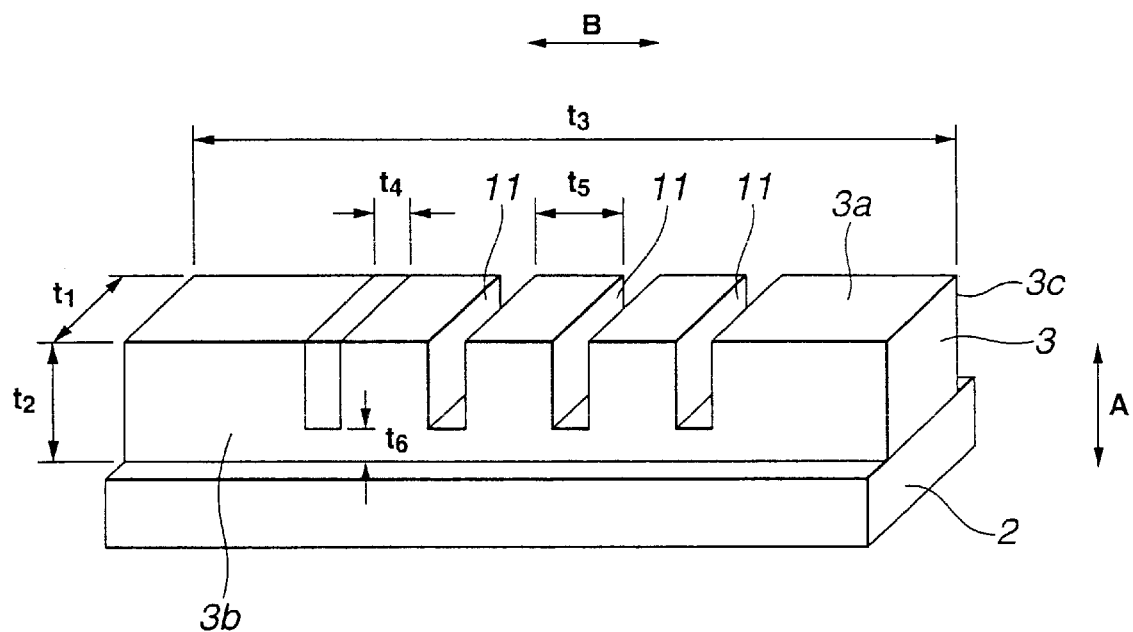
FIG. 1 is a perspective view showing a magnetic element according to the present invention.

Referring to the drawings, preferred embodiments of the present invention will be explained in detail.

The present invention is applied to a magnetic element 1 shown for example in FIG. 1.

This magnetic element 1, having a magnetic film 3, a lateral surface 3b of which faces a magnetic recording medium, such as a magnetic disc, is provided on a replay type magnetic head adapted for detecting signals recorded on the magnetic recording medium. The magnetic element 1, having the magneto-resistance effect, has its electrical resistance changed on application of a stray magnetic field from the magnetic recording medium. Moreover, the magnetic element 1 includes electrodes on the ends thereof perpendicular to the layering direction A and a potential difference is afforded across these electrodes to cause the current to flow in the in-plane direction B.

The magnetic element 1 includes a substrate 2, such as a glass substrate, and the magnetic film 3 having the magneto-resistive effect thereon.

The magnetic film 3 is made up of a plurality of films of different compositions, layered together, and exhibits a magneto-resistive effect, that is it has its electrical resistance value changed on application of a magnetic field thereto. This magnetic film 3 is of a multi-layered structure (artificial lattice structure) comprised of, for example, cobalt (Co) and copper (Cu) layers stacked periodically together. The magnetic film 3 in its entirety is magnetized along the in-plane direction B, with the Co layer acting as a magnetic layer. On deposition on the substrate 2, the magnetic film 3 is formed as fine lines each having a width $t_1$ approximately 1 $\mu$m, a film thickness $t_2$ of approximately 660 nm and a length $t_3$ of approximately 3 $\mu$m. The magnetic film 3 is formed with plural recesses 11 extending from one major surface 3a towards the substrate 2 along the layering direction A and from one lateral surface 3b towards the opposite side lateral surface 3c along the in-plane direction. These recesses 11 are each of a width $t_4$ on the order of 150 nm along the in-plane direction B and are formed at an interval $t_5$ of approximately 300 nm.

If the magnetic film 3 is of the above dimensions $t_1$ to $t_3$, the recess 11 is of a depth of approximately 330 nm from the major surface 3a towards the substrate 2. That is, the recess 11 is formed so that the ratio of the depth of the recess 11 to a length $t_6$ between the bottom of the recess 11 and the substrate 2 will be 1:1.

Figure 2:
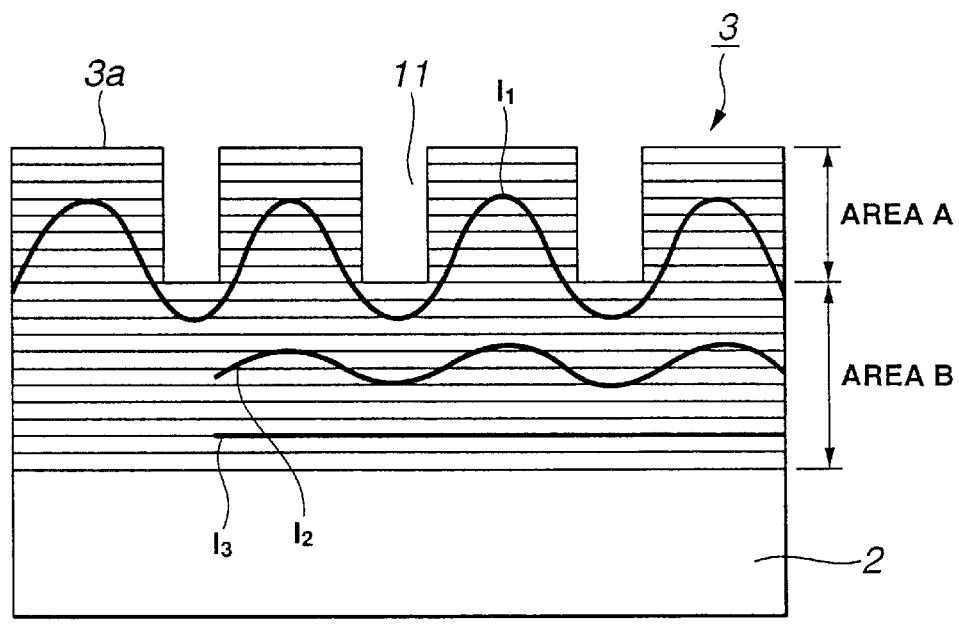
FIG. 2 illustrates a current path of the current flowing through a magnetic element according to the present invention.

In the above-described magnetic element 1, if electrodes are provided at both ends thereof along the in-plane direction B, and the current is supplied to flow along the in-plane direction B, the current flows as shown in FIG. 2. That is, in the area A of the magnetic element 1 where the recess 11 is formed, a current path $I_1$ is sinusoidal with the amplitude being smaller as the substrate 2 is approached from the area A, whereas, in a current path $I_2$, the current flows with a smaller amplitude. In a current path $I_3$ in the vicinity of the substrate 2, the current flows along a substantially rectilinear route.

Figure 3:
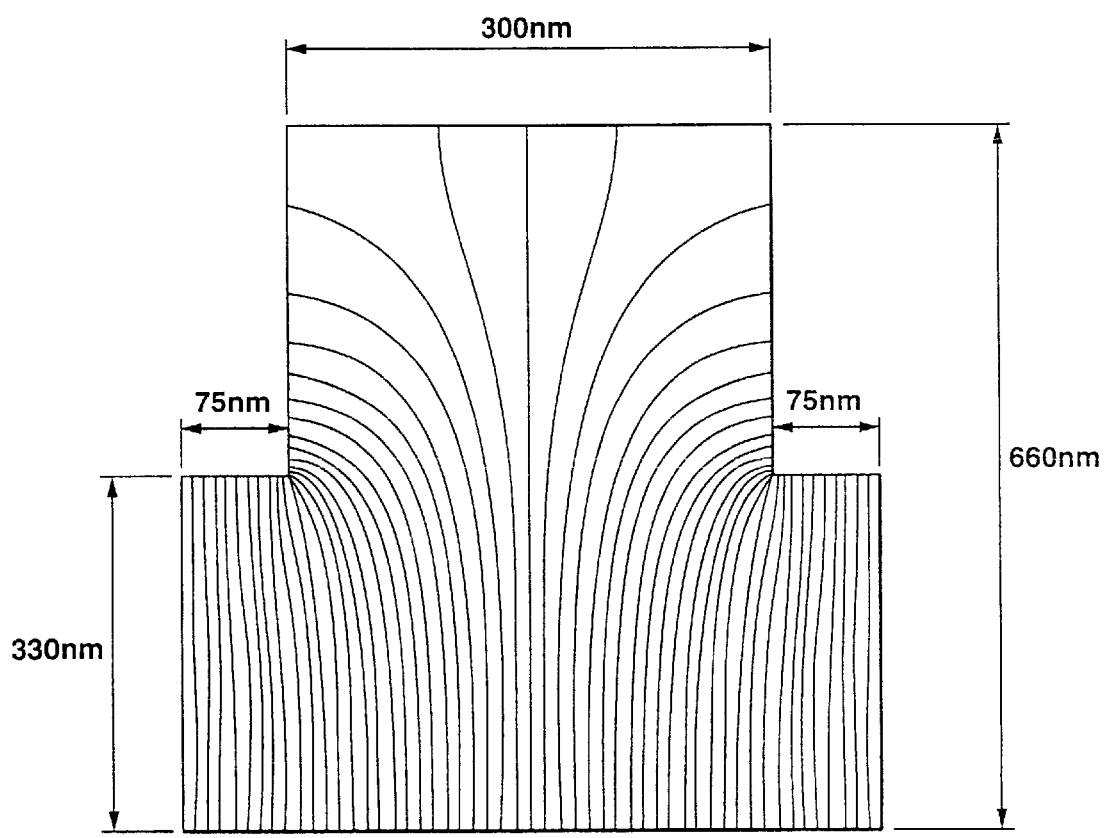
FIG. 3 shows an equi-potential distribution in a magnetic film of a magnetic element according to the present invention.

FIG. 3 shows the results of calculations of the equipotential distribution of a concave portion 11 and a convexed portion defined between two neighboring concave portions 11. The equipotential distribution, shown in FIG. 3, may be obtained by finding the Laplace equation by a differential method. In making calculations of the equipotential distribution, the overall film thickness, the film thickness from the bottom surface of the recess 11 to the substrate 2, the length of the bottom of the recess and the length of the recess 11 along the major surface 3a, were set to 660 nm, 330 nm, 75 nm and 300 nm, respectively.

It may be seen from FIG. 3 that by providing the recess 11, the current density distribution in the area A differs from that in the area B. That is, in the area A where the recess 11 is formed, it may be seen that conduction electrons traversing the boundaries of the respective layers making up the magnetic film 3 are more abundant than those lying in the area B.

A typical manufacturing method for the magnetic element 1 is hereinafter explained.

In preparing the magnetic element 1, a substrate 2, formed e.g., of glass, is first prepared. On this substrate 2, an Fe layer, with a film thickness of approximately 6.0 nm, is formed as an underlying layer. On this Fe layer, Co layers, each with a film thickness of 1.3 nm, and Cu layers, each with a film thickness of 2.0 nm, are layered by approximately 200 periods. On the Co—Cu layers, a Cu layer, as a protective film, may be deposited to a thickness of approximately 250 nm.

In forming the magnetic film 3, a two-pole three-dimensional RF magnetron sputtering method, for example, is used, under a film-forming condition of the vacuum degree of $6.8 \times 10^{-8}$ Torr, a making power of 120 W and an Ar gas pressure of 5 mTorr.

The surface of the magnetic film 3 then is etched, by e.g., FIB (focused ion beam), to form fine lines each with a length $t_3$, a width $t_1$ and with a film thickness $t_2$ of 3 $\mu$m, 1 $\mu$m and 660 nm, respectively, as shown in FIG. 1. Then, etching such as by FIB is carried out from the lateral surface 3b or from the opposite lateral surface 3c to form the recess 11. In etching by the FIB, Ga was used as a liquid metal ion source, and the acceleration voltage and the pull-out current were set to approximately 30 kV and 2.7 $\mu$A, respectively. This completes the magnetic element 1 shown in FIG. 1.

Figure 4:
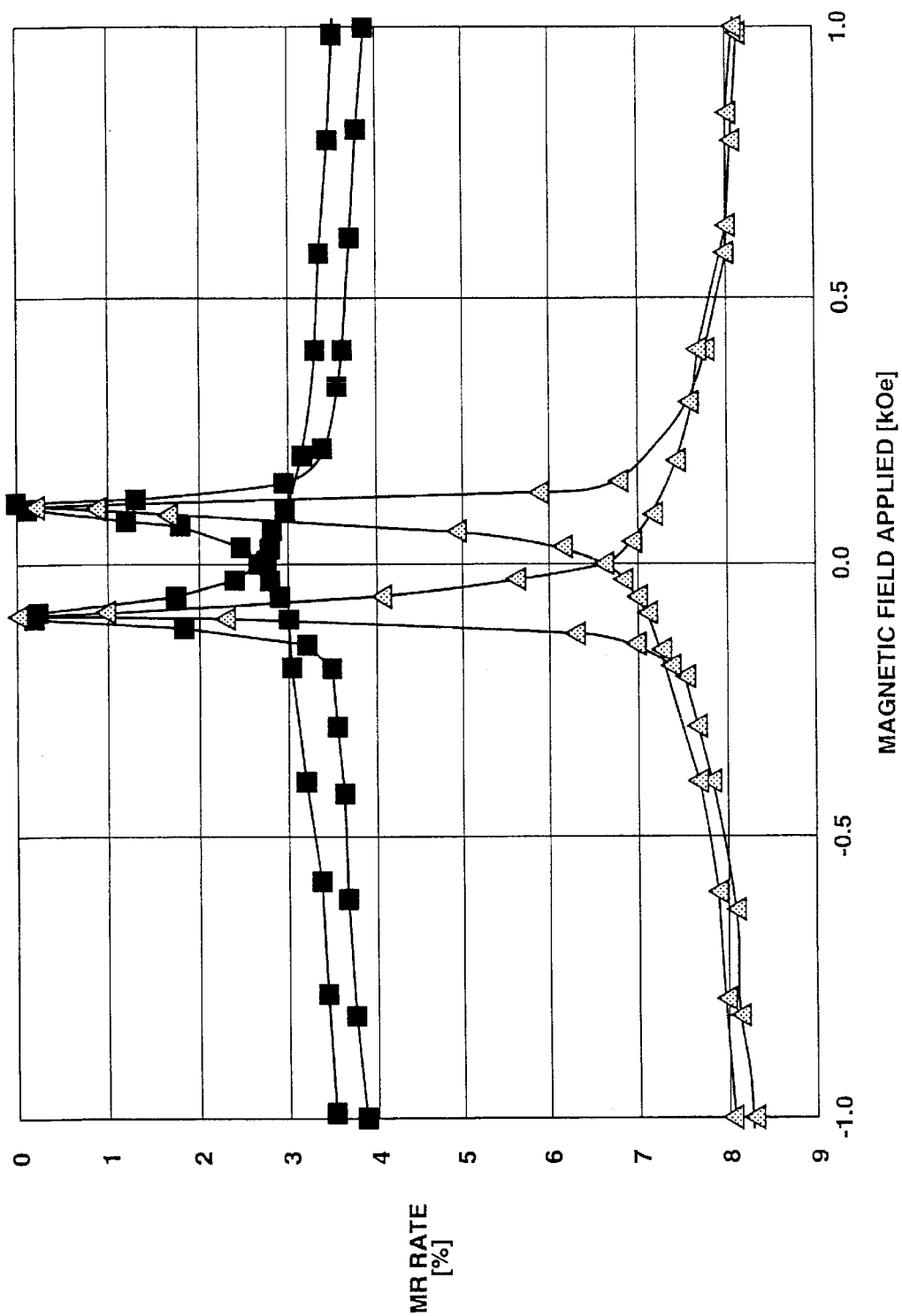
FIG. 4 is a graph showing the relation between the magnetic field of the magnetic element according to the present invention and the MR rate.

Referring to FIG. 4, the relation between the magnetic field [KOe] applied to the magnetic element 1 thus prepared and the MR rate [%] is now explained with respect to FIG. 4. In measuring the MR rate, electrodes are formed on both ends along the in-plane direction B of the magnetic element 1 to measure the magneto-resistance effect CIP-GMR when the current is supplied along the in-plane direction B.

In FIG. 4, the MR rate of the magnetic element 1 carrying the recess 11 and that of the magnetic element 1 not carrying the recess 11 are shown by a triangular mark and by a square mark, respectively.

In FIG. 4, the MR rate of the magnetic element 1 not carrying the recess 11 is 4.55%, whereas that of the magnetic element 1 carrying the recess 11 is 8.90%. Thus, it may be seen that the MR rate is increased as a result of provision of the recess 11. FIG. 4 shows an enlarged range of ±1 kOe in case the MR rate is measured when the magnetic field is applied in a range of ±15 kOe. Tt is noted that, in calculating the MR change rate, the applied magnetic field, normalized to the maximum magnetic field, is used as the basis for calculations.

Thus, with the present magnetic element 1, the component of the current supplied to the area A as a result of formation of the recess 11 along the layering direction A is increased to raise the MR rate. That is, with the magnetic element 1 carrying the recess 11, conduction electrons traversing the film interfaces of the respective layers are increased in number in the respective magnetic film 3 to increase spin-dependent scattering of the conduction electrons to raise the MR rate.

Thus, in the present magnetic element 1, the overall MR rate can be controlled by controlling e.g., the depth or the width of the recess 11 such as to increase the component of the conduction electrons along the direction of film thickness even if the current is supplied along the in-plane direction B.

Figure 5:
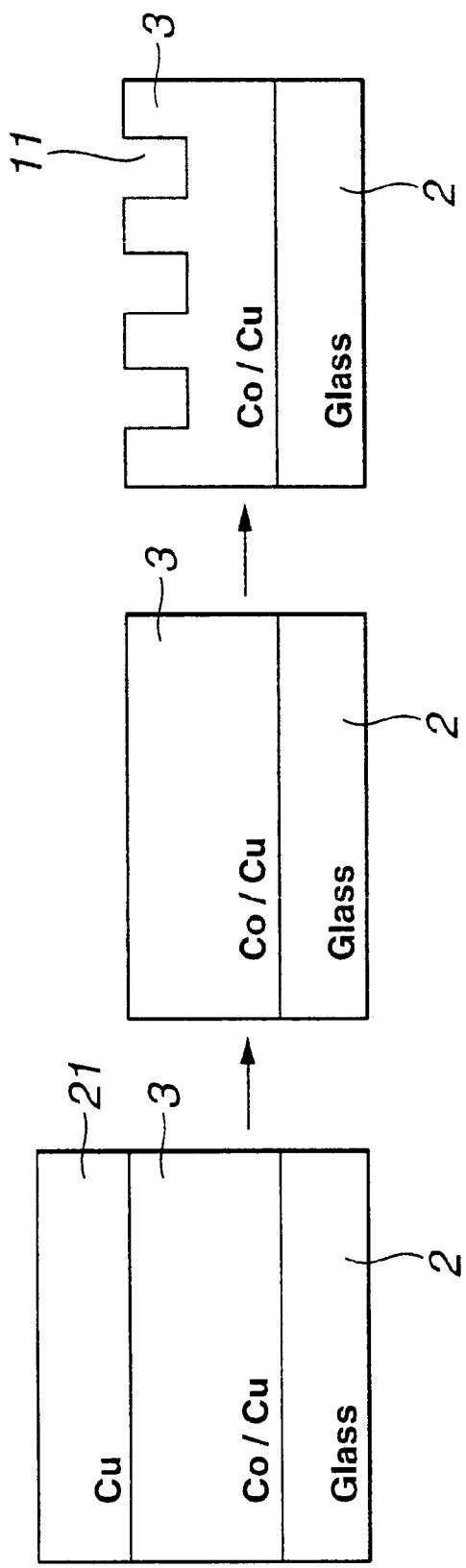
FIG. 5, consisting of FIGS. 5A TO 5C, illustrates a method for the preparation of a magnetic element not carrying a protective film.
Figure 6:
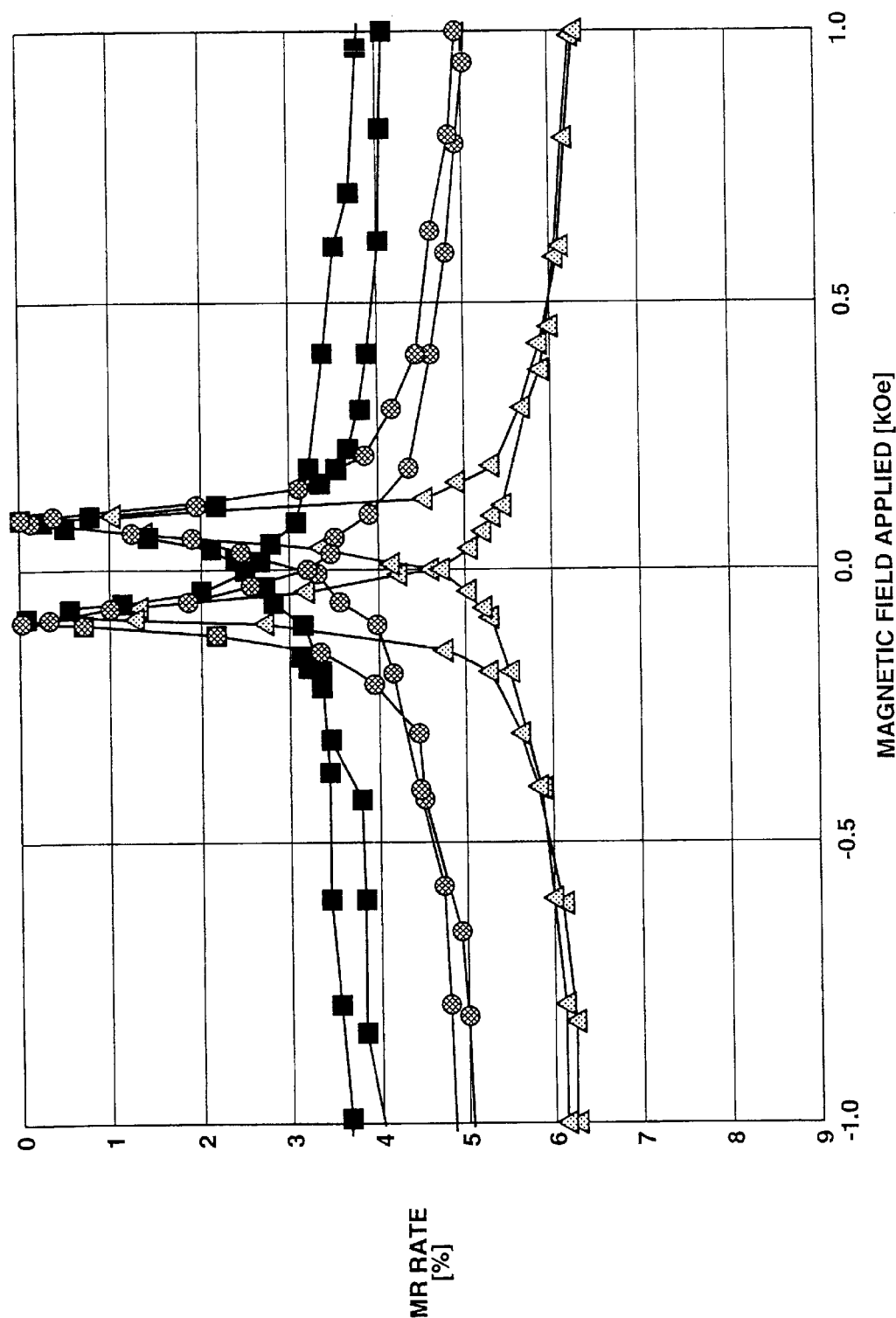
FIG. 6 is a graph showing the relation between the magnetic field applied to the magnetic element according to the present invention and the MR rate.

Referring to FIG. 6, the relation between the magnetic field applied to a magnetic element not having a protective layer, such as a Cu layer, on the magnetic film 3 (FIG. 5c), and the MR rate, is hereinafter explained. In preparing the magnetic element 1 not carrying the protective film, a layered film, made up of the substrate 2, magnetic film 3 and a protective film 21, is first prepared (FIG. 5a), the protective film 21 then is removed (FIG. 5b) and the recess 11 is finally formed to prepare a magnetic element not having the protective film 21 on its major surface 3a is prepared (FIG. 5c).

The MR rate of the magnetic element having a structure as shown in FIG. 5a is indicated by a square mark, whilst that of the magnetic element having a structure as shown in FIG. 5b is shown by a circular mark and that of the magnetic element having a structure as shown in FIG. 5c is shown by a triangular mark.

FIG. 6 shows that the MR rates for the structures shown in FIGS. 5a, 5b and 5c are approximately 4.57%, approximately 5.7% and approximately 6.89%, res.

Thus, even if the magnetic element 1 prepared is devoid of the protective film 21, as when the magnetic element 1 having the structure shown in FIG. 7b is prepared from the magnetic element having the structure shown in FIG. 7a, the MR rate can be improved by forming the recess 11.

The magnetic adjustment method according to the present invention is hereinafter explained.

The replay type magnetic head, having the above-described magnetic element 1, is used with the lateral surface 3b of the magnetic film 3 facing the magnetic recording medium, such as a magnetic disc. To this end, the magnetic head is produced so that its lateral surface is exposed to outside.

In such magnetic head, the magneto-resistance characteristics of the magnetic element 1 of the magnetic head produced are desirably uniform. However, the magnetic element 1 may be of different magneto-resistance characteristics, depending e.g., on film-forming conditions.

After preparation of the magnetic head, the lateral surface 3b is etched using a technique such as FIB to form a recess 11 to adjust the MR rate of the magnetic element 1. The dimension of the recess 11, such as, for example, its depth or width, is adjusted at this time, as the electrical resistance of the magnetic element 1 (MR rate) is measured, to realize the MR rate comprised in the pre-set range.

The present magnetic adjustment method may also be applied to a magnetic random access memory (MRAM). That is, after forming the MRAM, the MR rates of the respective magneto-resistive devices making up the MRAM are measured to form the recess in each magnetic element 1 to realize the pre-set range of the MR rate.

So, with the above-described magnetic adjustment method, the magnetic characteristics can be adjusted so as to be within the range of a pre-set standard, even in preparing a magnetic element, such as a magnetic head having a magnetic element 1, thus enabling improvement in the production yield of the magnetic head or the MRAM exploiting magneto-resistance effect.

In the foregoing description, the protuberance of the magnetic film 3 is formed by layered films of Cu and Co. In the following, the protuberance of the magnetic film is formed by a single layer of Cu.

An illustrative manufacturing method for the magnetic element 30, in which the first surface layer of the magnetic film is formed to a thicker thickness from the single Cu layer, is hereinafter explained.

In preparing the magnetic element 30, a substrate 31, such as a glass substrate, is prepared. On this substrate 2, an Fe layer, with a film thickness of approximately 6.0 nm, is formed as an underlying layer. On this Fe layer, Co layers, each with a film thickness of 1.3 nm, and Cu layers, each with a film thickness of 2.0 nm, are layered by approximately 200 periods. On the Co—Cu layers, a Cu layer, as a protective film, may be deposited to a thickness of approximately 330 nm.

In forming the magnetic film, a two-pole three-dimensional RF magnetron sputtering method, for example, is used, under a film-forming condition of the vacuum degree of $1.0 \times 10^{-7}$ Torr, a making power of 120 W and an Ar gas pressure of 5 mTorr.

The surface of the magnetic film 32 then is etched, by e.g., FIB (focused ion beam), to form fine lines each with a length $t_{13}$, a width $t_{11}$ and with a film thickness $t_{12}$ of approximately 6 μm, approximately 1 μm and 990 nm, respectively, as shown in FIG. 8. Then, etching such as by FIB is carried out from the lateral surface 32b or from the opposite lateral surface 33c to form a plurality of recesses 33. These recesses 33 are formed so as to have a width $t_{14}$ each of approximately 150 nm at an interval t16 of the order of approximately 300 nm from one another in the in-plane direction D. If the magnetic film 32 has the aforementioned dimensions $t_{11}$, $t_{12}$ and $t_{13}$, the recess 33 has a depth of approximately 330 nm from the lateral surface 33a towards the substrate 31 along the perpendicular direction C. That ism the recess 33 is formed so that the depth of the recess 33 has a ratio of 1:1 with respect to the length from the bottom of the recess 33 to the upper surface of the substrate 31.

In the aforementioned etching processing by e.g. the FIB, Ga was used for a liquid metal ion source, and the acceleration voltage and the pull-out current were set to approximately 30 kV and 2.3 μA, respectively. In this manner, the magnetic element 1 shown in FIG. 8 is prepared.

The relation between the magnetic field [KOe] applied to the magnetic element 30 thus prepared and the MR rate [%] is now explained with reference to FIG. 4. In measuring the MR rate, electrodes are formed on both ends along the in-plane direction D of the magnetic element 30 to measure the giant magneto-resistance effect CIP-GMR when the current is supplied along the in-plane direction D.

Figure 9:
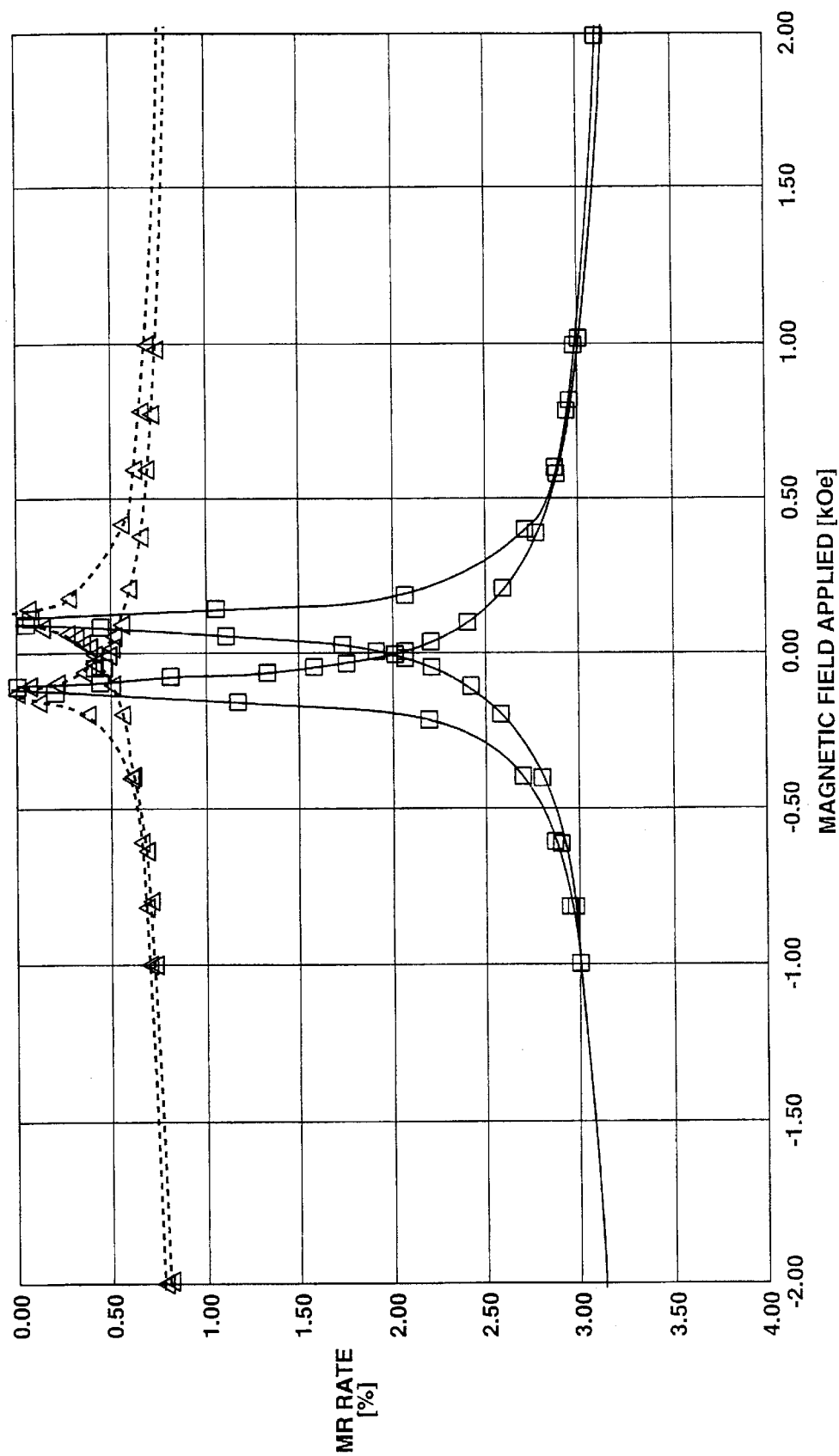
FIG. 9 is a graph showing the relation between the magnetic field of the magnetic element according to the present invention and the MR rate.

In FIG. 9, the MR rate of the magnetic element 1 carrying the recess 11 and that of the magnetic element 1 not carrying the recess 11 are shown by a square mark and by a triangular mark, respectively.

In FIG. 9, the MR rate of the magnetic element 30 having the projection of the Cu single layer between the neighboring recesses 33 is 3.52%, whereas that of the magnetic element 30 not having the recess 33 is 1.12%. It may be seen from this that the MR rate is increased as a result of the provision of the single Cu layer on the projection of the Cu single layer between the neighboring recesses 33 by etching. FIG. 9 shows an enlarged range of ±1 kOe in case the MR rate is measured when the magnetic field is applied in a range of ±15 kOe. It is noted that, in calculating the MR change rate, the magnetic field applied is normalized to the maximum magnetic field applied is used as the basis for calculations.

Figures 10A, 10B:
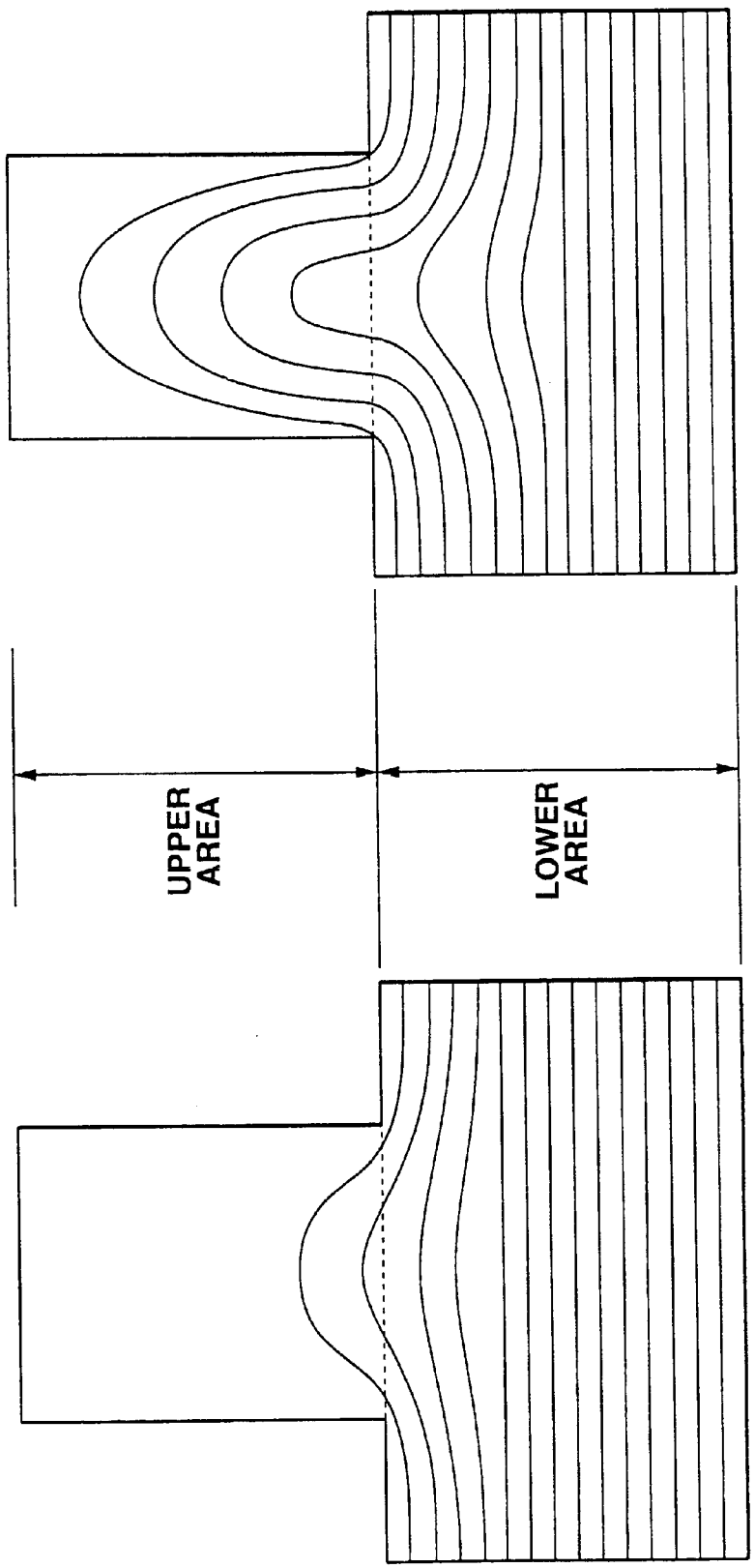
FIG. 10, consisting of FIGS. 10A and 10B, shows the current density distribution in a magnetic film of the magnetic element according to the present invention.

The results of calculations of the current density distribution in case the magnetic film is formed by layered Cu and Co films and etched are shown in FIG. 10a, whilst those in case the first surface layer of the magnetic film is formed to an increased thickness solely by Cu and not etched are shown in FIG. 10b. Meanwhile, the current density distribution shown in FIGS. 10a and 10b are obtained by analyses by the finite element method, and the maximum applied voltage, minimum applied voltage, ILX (mesh), resistivity for FIG. 10a and resistivity for FIG. 10b are set to 5 V, 0 V, 247,500 (1 nm2/mesh), $3 \times 10^{-7}$ Ωcm and $1.69 \times 10^{-8}$ Ωm, respectively.

From FIGS. 10a and 10b, it may be seen that, as a result of formation of the etching processing, the CPP (current perpendicular to the plane)-GMR component is increased by the grooves being formed by etching. Moreover, in FIG. 10b, the CPP-GMR component is increased in a lower area than in FIG. 10a. So, with the magnetic film, the upper area of which is formed by the single-layer film, the MR rate may be expected to be increased by the CPP-GMR component in the lower area.

The shape of the film formed on the substrate 31 was observed using a scanning type ion microscope (SIM).

The MR rate was measured at room temperature, at the maximum applied magnetic field of 15 [kOe] by the D.C. four-terminal resistance method. The MR rate was calculated by the following equation:

$$MR = (Rmax - Rmin)/Rmin \times 100\%$$

where Rmax denotes the resistance of the zero magnetic field and Rmin denotes the resistance of the saturated magnetic field.

The magnetic adjustment method according to the present invention is hereinafter explained.

The replay type magnetic head, having the above-described magnetic element 1, is used with the lateral surface 33 of the magnetic film 32 facing the magnetic recording medium, such as a magnetic disc. To this end, the magnetic head is produced so that its lateral surface 33b is exposed to outside.

In such magnetic head, the magneto-resistance characteristics of the magnetic element 30 of the magnetic head produced are desirably uniform. However, the magnetic element 30 may be of different magneto-resistance characteristics, depending e.g., on film-forming conditions.

After the magnetic head has been prepared, the lateral surface 3b is etched using a technique, such as FIB, to form a recess 33 to adjust the MR rate of the magnetic element 1. The dimension of the recess 11, such as, for example, its depth or width, is adjusted at this time, as the electrical resistance of the magnetic element 1 (MR rate) is measured, to realize the MR rate in the pre-set range.

The present magnetic adjustment method may also be applied to a magnetic random access memory (MRAM). That is, after forming the MRAM, the MR rates of the respective magneto-resistive devices making up the MRAM are measured to form the recess 33 in each magnetic element 30 to realize the pre-set range of the MR rate.

So, with the above-described magnetic adjustment method, the magnetic characteristics can be adjusted so as to be within the range as prescribed in a relevant standard, even in preparing a magnetic device such as a magnetic head having a magnetic element 30, thus enabling improvement in the production yield of the magnetic head or the MRAM exploiting magneto-resistance effect.

What is claimed is:

1. A magnetic head comprising:
    a magneto-resistance element having a magneto-resistance effect of the electrical resistance value being changed as a result of application of a stray magnetic field from a magnetic recording medium, said magneto-resistance element being made up of a plurality of layered films of different compositions and having a recess for transmitting the current along the layering direction of said layered films; and
    paired electrodes formed at both end faces of the magneto-resistance element perpendicular to said layering direction; wherein
        a projection neighboring to said recess is made up of a plurality of layered films of a unitary composition.

2. The magnetic head according to claim 1 wherein said recess is formed for extending from a major surface of said layered films along the film layering direction.

3. The magnetic head according to claim 1 wherein said recess is formed for extending from a lateral surface of said layered film along the in-plane direction.

4. The magnetic head according to claim 1 wherein said magneto-resistance element is of a multi-layered structure (artificial lattice structure) comprised of cobalt (Co) and copper (Cu) layers stacked periodically together.

5. The magnetic head according to claim 4 wherein said magneto-resistance element has a Cu layer as a protective film which is deposited on the multi-layered structure.

6. The magnetic head according to claim 1 wherein said magneto-resistance element is of a multi-layered structure comprised of cobalt (Co) layers each with a film thickness of 1.3 mm and copper (Cu) layers each with a film thickness of 2.0 nm stacked together by 200 periods.

7. The magnetic head according to claim 6 wherein said magneto-resistance element has a Cu layer as protective film which is deposited to a thickness of 25 nm on the multi-layered structure comprised of the cobalt (Co) layers each with a film thickness of 1.3 nm and the copper (Cu) layers each with a film thickness of 2.0 nm stacked together by 200 periods.

* * * * *

UNITED STATES PATENT AND TRADEMARK OFFICE
CERTIFICATE OF CORRECTION

PATENT NO. : 6,707,648 B2
DATED : March 16, 2004
INVENTOR(S) : Akiyoshi Itoh

It is certified that error appears in the above-identified patent and that said Letters Patent is hereby corrected as shown below:

<u>Title page,</u>
Item [73], Assignee, should read: -- Nihon University (JP) --.

Signed and Sealed this

Twenty-ninth Day of June, 2004

JON W. DUDAS
*Acting Director of the United States Patent and Trademark Office*